United States Patent
Hutchins et al.

(10) Patent No.: US 9,774,304 B2
(45) Date of Patent: Sep. 26, 2017

(54) TRANS-IMPEDANCE AMPLIFIER ARRANGEMENT AND CONTROL MODULE

(71) Applicant: Hilight Semiconductor Limited, Hampshire (GB)

(72) Inventors: Derek John Hutchins, Ringwood Hants (GB); Patrick Etienne Richard, Thouare-sur-Loire (FR); George James Brocklehurst, Ringwood Hants (GB); William Redman-White, Four Marks (GB)

(73) Assignee: HILIGHT SEMICONDUCTOR LIMITED, Hampshire (GB)

(*) Notice: Subject to any disclaimer, the term of this patent is extended or adjusted under 35 U.S.C. 154(b) by 214 days.

(21) Appl. No.: 14/849,764

(22) Filed: Sep. 10, 2015

(65) Prior Publication Data
US 2016/0079936 A1 Mar. 17, 2016

(30) Foreign Application Priority Data
Sep. 16, 2014 (GB) .................................. 1416320.8

(51) Int. Cl.
- *H04B 10/69* (2013.01)
- *H03F 3/08* (2006.01)
- *H03G 3/30* (2006.01)

(52) U.S. Cl.
CPC ............. *H03F 3/08* (2013.01); *H03G 3/3084* (2013.01); *H04B 10/6931* (2013.01); *H04B 10/6932* (2013.01); *H04B 10/6933* (2013.01)

(58) Field of Classification Search
CPC ... H03F 3/08; H04B 10/6933; H04B 10/6932; H04B 10/6931; H03G 3/3084
See application file for complete search history.

(56) References Cited

U.S. PATENT DOCUMENTS

| | | |
|---|---|---|
| 2009/0200450 A1 | 8/2009 | Nomura |
| 2010/0209100 A1 | 8/2010 | Uesaka et al. |
| 2013/0294766 A1 | 11/2013 | Cai et al. |
| 2015/0168211 A1* | 6/2015 | Nomura .............. H03M 1/1038 250/214 C |

FOREIGN PATENT DOCUMENTS

| | | |
|---|---|---|
| JP | 2009 164728 | 7/2009 |
| WO | WO 99/31830 | 6/1999 |

\* cited by examiner

*Primary Examiner* — Tony Ko
(74) *Attorney, Agent, or Firm* — Leveque IP Law, P.C.

(57) ABSTRACT

A trans-impedance amplifier arrangement has an input configured to receive an output from a photo-detector, a current monitoring circuit configured in use to provide a current monitor signal dependent on a current through the photo-detector, and an output configured to output said current monitor signal to a control module, said output further configured to receive control information from said control module. A control module is configured to receive the current monitor signal and to provide the control information.

20 Claims, 12 Drawing Sheets

TRANS-IMPEDANCE AMPLIFIER ARRANGEMENT AND CONTROL MODULE

FIELD OF THE INVENTION

Some embodiments relate to a trans-impedance amplifier arrangement, a control module and a combination thereof.

BACKGROUND OF THE INVENTION

A trans-impedance amplifier is an amplifier circuit arranged to convert a current into a voltage. The gain of a trans-impedance amplifier is the ratio of the output voltage to the input current. The magnitude of the gain provided by the trans-impedance amplifier can be controlled by a feedback resistor. In some arrangements the feedback resistor is connected between the inverting input and the output of an inverting amplifier with high input impedance. The input impedance of the inverting amplifier causes the input current to flow through the feedback resistor producing the output voltage.

SUMMARY

According to an embodiment, there is provided a trans-impedance amplifier arrangement comprising: an input configured to receive an output from a photo-detector; a current monitoring circuit configured in use to provide a current monitor signal dependent on a current through the photo-detector; an output configured to output said current monitor signal to a control module, said output further configured to receive control information from said control module.

The current monitoring circuit may comprise a current mirror.

The output may be further configured to provide said received control information to a control circuit.

The control circuit may be configured to compare at least part of said received control information with a predetermined code.

The control circuit may be configured to provide configuration information to one or more configurable modules of the trans-impedance amplifier in dependence on said the result of said comparing.

The control circuit may comprise a shift register for receiving said control information.

The control information may be transmitted by a modulated signal.

The output may be further configured to transmit information relating to at least one of configuration and operation of the trans-impedance amplifier to said control module.

The trans-impedance amplifier information may be transmitted by the current monitor signal.

The trans-impedance amplifier arrangement comprising a selector configured to modulate said current monitor signal to transmit said trans-impedance amplifier information.

One or more discrete current values may be added at different times so as not to alter the average current value of the current monitor signal and to provide said trans-impedance amplifier information.

The trans-impedance amplifier arrangement may comprise a first current source; a second current source; and a selector configured to connect the output to the first and second current sources dependent on said trans-impedance amplifier information.

According an embodiment, there is provided a control module comprising: an input configured, in use, to receive data from a trans-impedance amplifier circuit; and a control circuit configured, in use, to provide control information to said trans-impedance amplifier circuit via an output, said output further configured to receive a current monitor signal from said trans-impedance amplifier circuit.

The control information may comprise a control header.

The control header may be useable by the trans-impedance amplifier circuit to determine when control information has been received.

The control information may comprise configuration information for one or more configurable modules of the trans-impedance amplifier.

The control module may be configured to transmit said control information with a modulated signal.

One of a voltage and a current may be modulated to provide said control information.

The received current monitor signal may comprise an average current signal and one or more discrete current values corresponding to trans-impedance amplifier information.

The control module may comprise a voltage selector configured to modulate a voltage of said output by modulating a reference voltage.

The control module may comprise an operational amplifier and wherein in use: an inverting input of said operational amplifier is provided to said output; and a non-inverting input of said operational amplifier is modulated in dependence on said control information.

The control module may comprise a feedback resistor between the inverting input of said operational amplifier and the output of said operational amplifier.

In some embodiments, a compensation current is provided to the inverting input of the operational amplifier so as to substantially cancel out voltage changes at the output of said operational amplifier caused by modulating said non-inverting input.

The control module may comprise a circuit configured to receive a current into the inverting input such that the value of the current is not affected by the modulation of the non-inverting input.

The control module may comprise a transistor configured to one of draw current from or supply current to the inverting input of said operational amplifier, said transistor being controlled by an output of said operational amplifier; and a load resistor configured to convert the current drawn or supplied by the transistor to a voltage.

The control module may comprise a filter configured to filter a signal received at said output so as to separate said trans-impedance amplifier information from said current monitor signal.

The filter may comprise at least one of: a filter configured to extract the current monitor signal; and a filter configured to extract a signal corresponding to trans-impedance amplifier information.

According to an embodiment there is provided a trans-impedance amplifier as provided by the first embodiment in combination with a control module as described in the second embodiment.

BRIEF DESCRIPTION OF FIGURES

For a better understanding of some embodiments, reference will be made by way of example only to the accompanying drawings in which.

DETAILED DESCRIPTION OF EMBODIMENTS

A trans-impedance amplifier may be arranged to receive the output current of a photo-detector such as a photodiode. The photo-detector may be used to receive a signal. For example, in some embodiments the signal may be a pulsed light signal from an optical transmission source over an optical fibre. A current monitor output (IMON) may be provided to provide an average current signal that mirrors the average current through the photo-detector. The current monitor output may be provided by a current mirror arranged to mirror a current between two pins connected to the photo-detector.

Some photo-detectors may require a finely tuned external bias voltage and as such have one connection to the trans-impedance amplifier and one connection to the external bias circuitry. Accordingly in some embodiments the current monitor may be produced by mirroring current drawn through amplifier circuitry.

The current monitor output may be used to measure optical performance of a fibre optic system. The average current of the current monitor output may be used to provide a representation of the average light intensity received at the photo-detector. Accordingly, the performance of the photo-detector may be measured by the current monitor output.

This may be for example used to monitor if the optical source has degraded or to characterize the optical source.

The trans-impedance amplifier integrated circuit may comprise a single voltage output.

In other embodiments, there may be circuitry arranged to provide a pair of voltage complementary outputs where the signal of the first output is the inverse signal of the second output. The difference between these two voltage outputs may be used to calculate the output signal. The two output signals may be in close proximity. This output method may have the advantage that noise may affect both output signals equally. Accordingly, the difference between the two signals would remain unaffected thus reducing the effect of noise on the output.

Figure 1A:
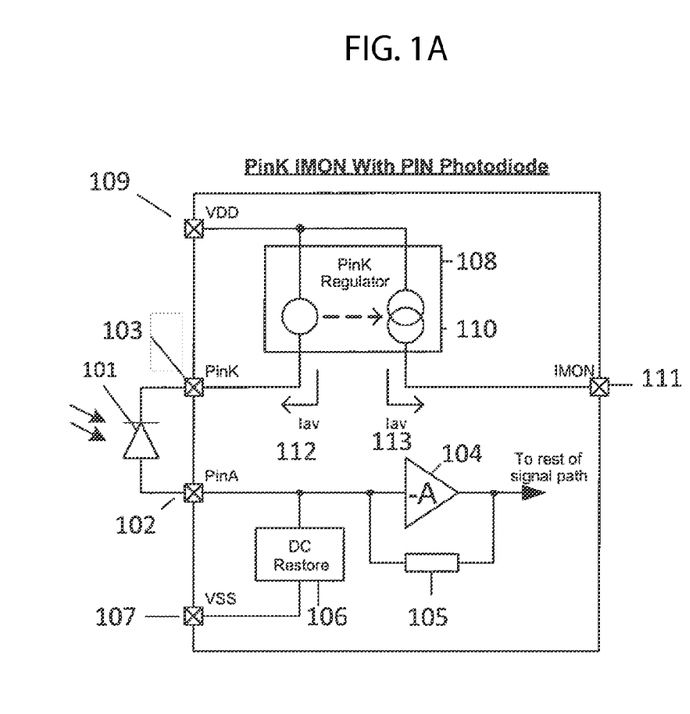
FIG. 1A shows a trans-impedance amplifier circuit with a current monitor output of some embodiments.

Reference is now made to FIG. 1A which shows a trans-impedance amplifier circuit having a photodiode 101 provided between two pins: PinA 102 and PinK 103. In the configuration of FIG. 1A, the anode of the photodiode 101 is coupled to PinA 102 whilst the cathode is coupled to PinK 103. PinA 102 is an input terminal for receiving current from the photodiode 101. An amplifier 104 is provided between PinA 102 and an output with a feedback resistor 105 between the input and the output of the amplifier 104. A DC restore circuit 106 is connected between PinA 102 and the negative power supply VSS 107. A voltage regulator 108 is provided between the positive supply rail VDD 109 and PinK 103. The voltage regulator 108 comprises a current mirror 110 which is connected to a current monitor output IMON 111. The average current through the photodiode 112 is provided by the voltage regulator 108 through PinK 103. Accordingly the current 113 output by the current mirror 110 to the IMON output 111 is a mirror of the average photodiode current 112.

The current monitor output (IMON) is used to provide an average of the photodiode current. This current can be measured and used to provide an indication of average signal intensity. In some embodiments the IMON output may be monitored to detect performance issues. In one embodiment, a drop in the IMON output current may indicate that the photodiode is faulty. In another embodiment, a drop in the IMON output current could be detected and used to identify degradation in performance of a light source.

Figure 1B:
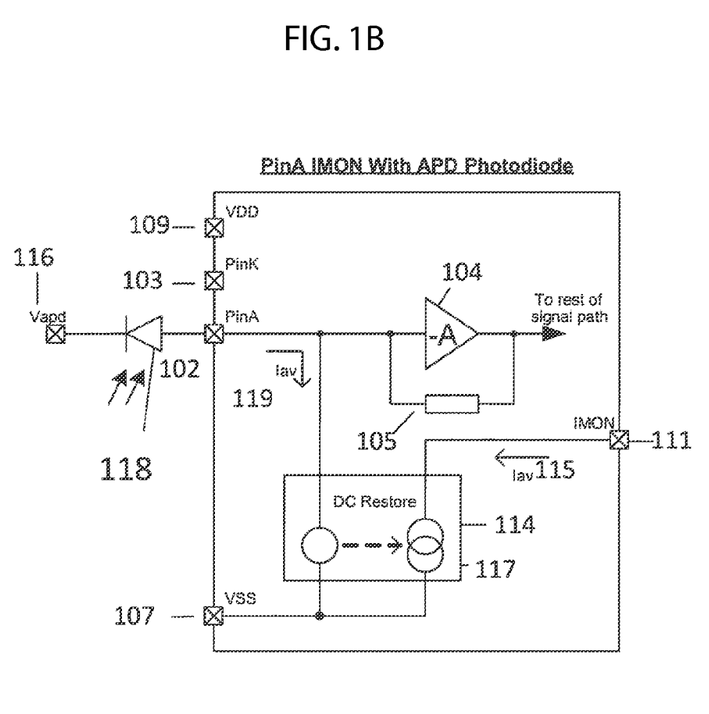
FIG. 1B shows a trans-impedance amplifier circuit with a current monitor output of other embodiments.

Reference is now made to FIG. 1B which shows a trans-impedance amplifier circuit with a current monitor output for an avalanche photodiode (APD). An APD may require a finely tuned bias voltage which may be applied from an external source. Accordingly an APD may not be suitable for connection between PinA and PinK. In the configuration of FIG. 1B, the anode of the APD 118 is provided to PinA 102 whilst the cathode is provided to an external bias voltage Vapd 116. An amplifier 104 is provided between PinA 102 and an output with a feedback resistor 105 between the input and the output of the amplifier 104. A DC restore circuit 114 is provided between PinA 102 and the negative power supply VSS 107. The DC restore circuit 114 comprises a current mirror 117 which is output to a current monitor output IMON 111. The average current through the photodiode 119 flows through the DC Restore circuit. Accordingly the current 115 output by the current mirror to the IMON output 111 is a mirror of the average photodiode current 119.

Figure 2:
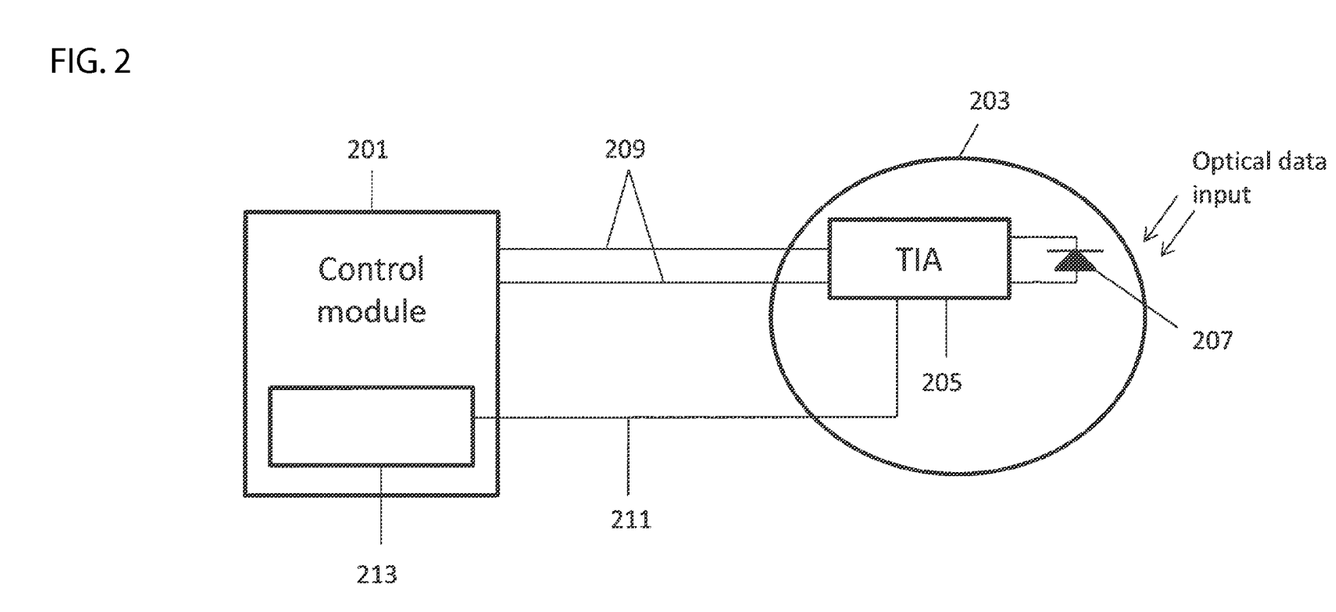
FIG. 2 shows a trans-impedance amplifier circuit connected to a controlling module.

Reference is made to FIG. 2 which shows an arrangement of some embodiments. A trans-impedance amplifier package 203 is provided. Trans-impedance amplifier package 203 comprises trans-impedance amplifier circuitry 205 coupled to photo-detector 207. Photo-detector 207 may be configured to receive optical data. The optical data may be provided over a fibre-optic cable. Trans-impedance amplifier circuitry 205 is configured to provide at an output 209 wherein the output 209 corresponds to the received optical data. The output may comprise a single output pin in some embodiments. In other embodiments, the output may be provided by two or more output pins. The output 209 is provided to a control module 201 which may be in communication with one or more circuits. Control module 201 may be configured to route the data received from the output 209 to a destination where said data is needed. Trans-impedance amplifier package 203 provides current mirror output 211 to control module 201. Accordingly control module 201 may monitor the average current through photo-detector 207. This average current may be used to estimate the average incident light received at photo-detector 207. This can be used for any suitable purpose. For example this may be used to indicate performance degradation of the optical source. Control circuit 213 is provided to receive the current monitor information in the control module.

Control 201 module may comprise a microprocessor. In other embodiments the control module 201 may comprise a programmable logic device (PLD) or a field programmable gate array (FPGA). In other embodiments the control module 201 may comprise an application specific integrated circuit (ASIC).

The control circuit 213 is configured to communicate with trans-impedance amplifier package 203. This communication may comprise providing control information to the trans-impedance amplifier package. This may allow one or more problems to be addressed, in some embodiments.

The control module 201 and the trans-impedance amplifier package 203 may be manufactured by different suppliers. Accordingly, to ensure inter-operability, it may be necessary to produce control module 201 and trans-impedance amplifier package 203 with large tolerances. In other words, to ensure that the trans-impedance amplifier package of one producer works with the control module of another, both may be over engineered. This may lead to overall inefficiency. For example, the supply voltage or the bandwidth of the trans-impedance amplifier may be higher than would be required to successfully operate. In large banks of photo-detectors, this inefficiency may lead to large amounts of unnecessary heat which may be difficult to remove.

In some embodiments, control module 201 may be configured to communicate with trans-impedance amplifier package 203 over current monitor output 211. This removes the need for additional pins on both the control module and the photo-detector. This may allow the photo-detector to use the same package and allow it to communicate with control modules of other manufacturers.

The control module may be configured to dynamically adjust the performance of the trans-impedance amplifier package. For example, in one embodiment the control module may be configured to increase the bandwidth of the trans-impedance amplifier package during high transmission periods to allow more data to be transmitted. In another example, the control module may be configured to reduce the bandwidth during low transmission periods to reduce power consumption and/or thermal output. It should be appreciated that bandwidth has been used by way of example and other variables may be increased or reduced by the control module.

The control module may be configured to control the trans-impedance amplifier package to specific characteristics such that a single trans-impedance amplifier can be used in a variety of applications.

In some embodiments the control module is configured to communicate with the trans-impedance amplifier. In other embodiments the communication may be from the trans-impedance amplifier to the control module. In other embodiments the communication may be two way.

Figure 3:
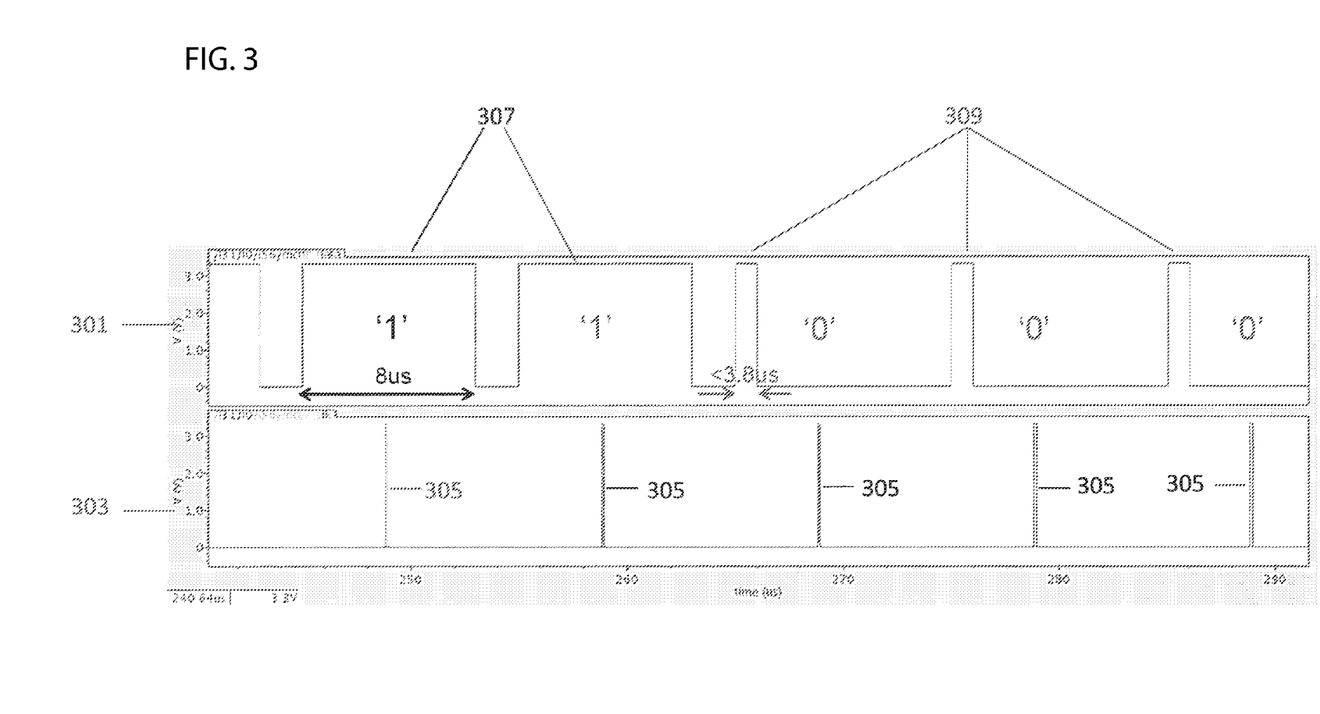
FIG. 3 shows a data waveform and recovered clock signal according to some embodiments.

Reference is made to FIG. 3 which shows a waveform of a communication scheme using the current monitor signal pathway to provide communication according to some embodiments. It should be appreciated that the communication scheme is by way of example and other communications schemes may be employed. Data waveform 301 shows the voltage of the current monitor line 211 over time during a communication from the control module. Clock waveform 303 shows a clock signal calculated from the current monitor line. The data may be communicated over current monitor line 211 by pulse width modulation. It should be appreciated that the use of pulse width modulation is by way of example and others methods of modulation and data encoding may be used. Two pulse lengths are used. In one example, a pulse length of 8 μs encodes logic '1' whilst a pulse of less than 3.8 μs encodes logic '0'. It should be appreciated that other pulse lengths may be used. It should also be appreciated that the terms logic '0' and logic '1' may be exchanged. Each pulse is followed by a waiting period dependent on the pulse length to the effect that the starts of the pulses are a fixed time apart. In one embodiment, clock signal 303 is calculated from the rising edges of the pulse on current monitor line 211. This rising edge is converted into a short pulse 305 and is delayed by a time period that falls between the two pulse lengths. In another embodiment, clock signal 303 is calculated from the falling edges of the pulse current monitor line 211 and is used to generate pulses 305. Clock signal 303 is used to sample data 301. The delay of the clock pulse causes the data to be sampled as high during a pulse encoding logic '1' and low during a pulse encoding logic '0'. In other embodiments data may be sampled as high if during a pulse encoding logic '0' and low during a pulse encoding logic '1'. FIG. 3 shows an example with the current monitor line with two long pulses 307 encoding logic '1' followed by three short pulses encoding logic '0'.

Since the current monitor signal is provided by a current source, it may be possible to provide a voltage to the current monitor signal line at the control module without affecting the current monitor current signal. Accordingly in some embodiments, the control module may communicate with the trans-impedance amplifier without interrupting the current monitor output but using the same communication pathway.

In other embodiments the current monitor output may be converted into a voltage at the monitor pin of the TIA and the control data may be in the form of a current from the control module. In some embodiments the control module and the trans-impedance amplifier may be configured to not output at the same time and instead use a time division approach.

Figure 4:
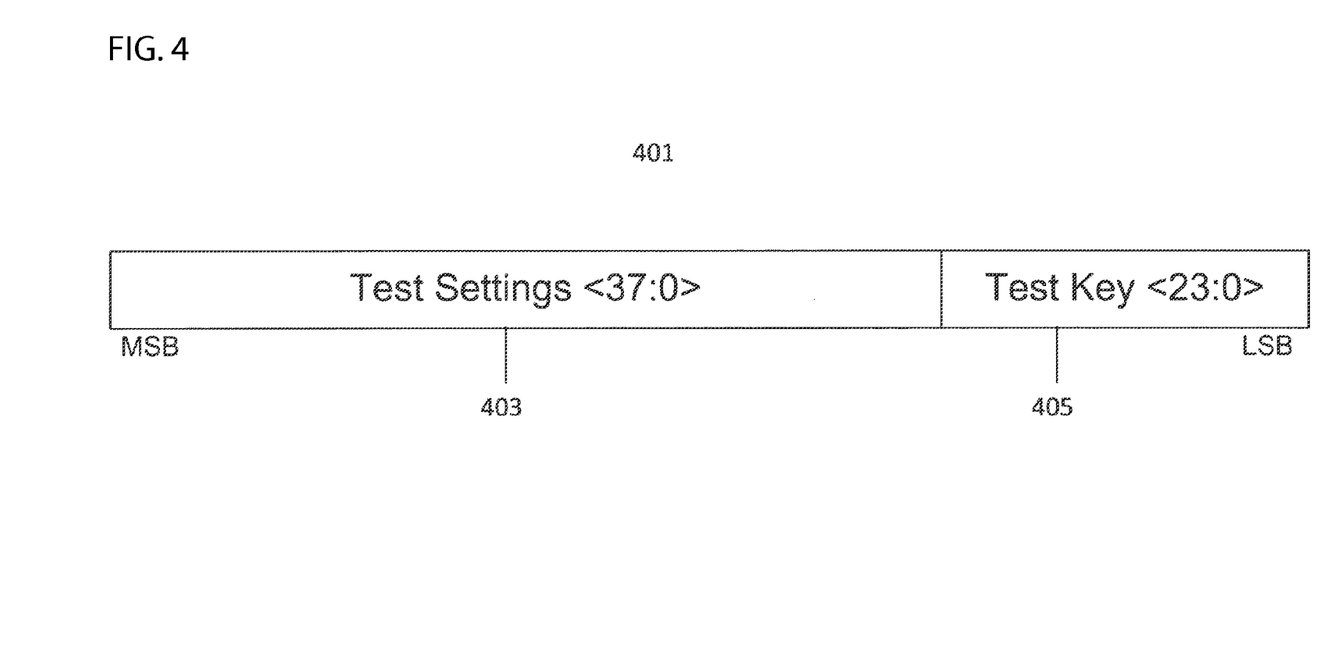
FIG. 4 shows a word of the communication scheme of some embodiments.

Reference is made to FIG. 4 which shows a word of an example communication scheme of some embodiments. Word 401 comprises control header 405 and control data 403. Control header 405 comprises a number of bits which allow the trans-impedance amplifier package to determine if a word is received. The control header may be used to indicate the source of the control module to the trans-impedance amplifier. Alternatively or additionally the control header may be used to verify that the signal received is an intentional signal and not a product of noise. The remainder of word 401 is the control data 403. Control data 403 may comprise a number of bits configured to provide setting information for one or more settings to the trans-impedance amplifier package. Through these control bits, the control module is able to communicate new setting information to the trans-impedance amplifier package. In the example of FIG. 4, the word comprises 62 bits of which 24 bits comprise the control header and the remaining 38 bits comprise the control data. It should be appreciated that other sizes of control header and control data may be used. It should be appreciated that the control header does not need to be at either end of the word. In some embodiments the bits of the control header may be distributed amongst the bits of the control data. In other embodiments the entire word may comprise the functionality of both the control header and the control data. For example, the received word may be compared to a list of valid codes. If the word does not match any of the valid codes then it is ignored. If the word does match a valid code then the configuration of the trans-impedance amplifier may be changed in accordance with a configuration specific to the valid code.

Figure 5:
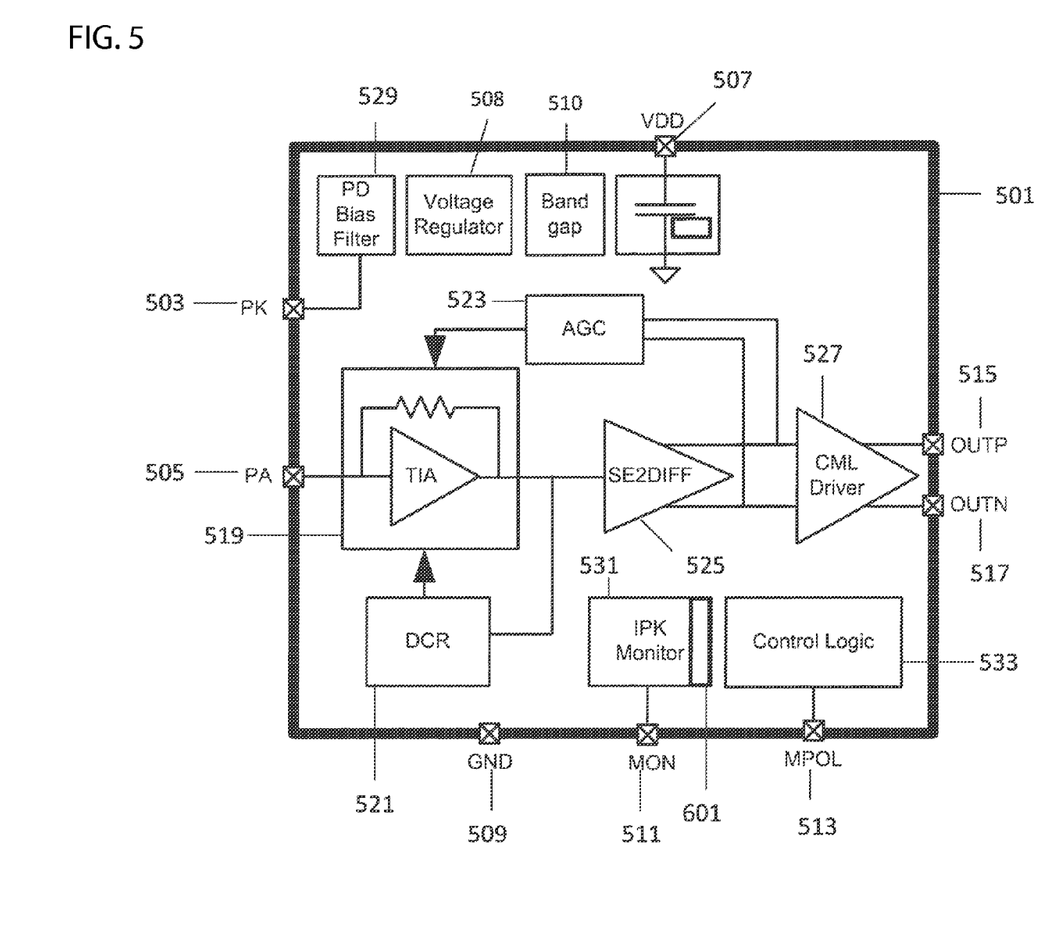
FIG. 5 shows a trans-impedance amplifier integrated circuit of some embodiments.

Reference is made to FIG. 5 which shows a trans-impedance amplifier integrated circuit of some embodiments. Integrated circuit 501 comprises power supply pin (VDD) 507, ground pin (GND) 509, current monitor pin (MON) 511, monitor polarity pin (MPOL) 513, bias voltage pin (PK) 503, photo-detector input pin (PA) 505 and output pins (OUTP and OUTN) 515 and 517. Photo-detector bias filter 529 provides a bias voltage to PK 503. A voltage regulator 508 and band gap circuit 510 are provided. The photo-detector input pin PA 505 provides current input from a photo-detector to trans-impedance amplifier (TIA) 519. The gain of the TIA 519 is controlled by an automatic gain controller (AGC) 523. The output of TIA 519 is provided to a single end to differential converter (SE2DIFF) 525 which is configured to convert the TIA output into a differential signal path. The differential signal path is provided to a current-mode logic (CML) driver 527 which provides outputs 515 and 517. The outputs of the convertor SE2DIFF 525 are further configured to control the AGC 523 to control the gain of TIA 519. A DC restore control loop 521 is configured to control the DC voltage across the TIA 519 to 0V or some other convenient reference value. Current monitor circuitry 531 is provided to provide the current monitor output 511. Control logic 533 is provided to receive a control signal from the MPOL pin which may determine the polarity of the current monitor output. A decoder 601 may be provided to receive and decode the control information from the control module.

The decoder may be configured to provide configuration information to a number of parts of the trans-impedance amplifier package. This configuration information may be used to set a number of parameters.

For example:
whether the current monitor output sources or sinks current;
enabling of the DC restore loop;
enabling the automatic gain control;
the bandwidth of the SE2DIFF; and
ptat (proportional to absolute temperature) settings of the CML driver.

It should be appreciated these parameters are listed by way of example and other parameters of the trans-impedance amplifier may alternative or additionally be configured.

Figure 6:
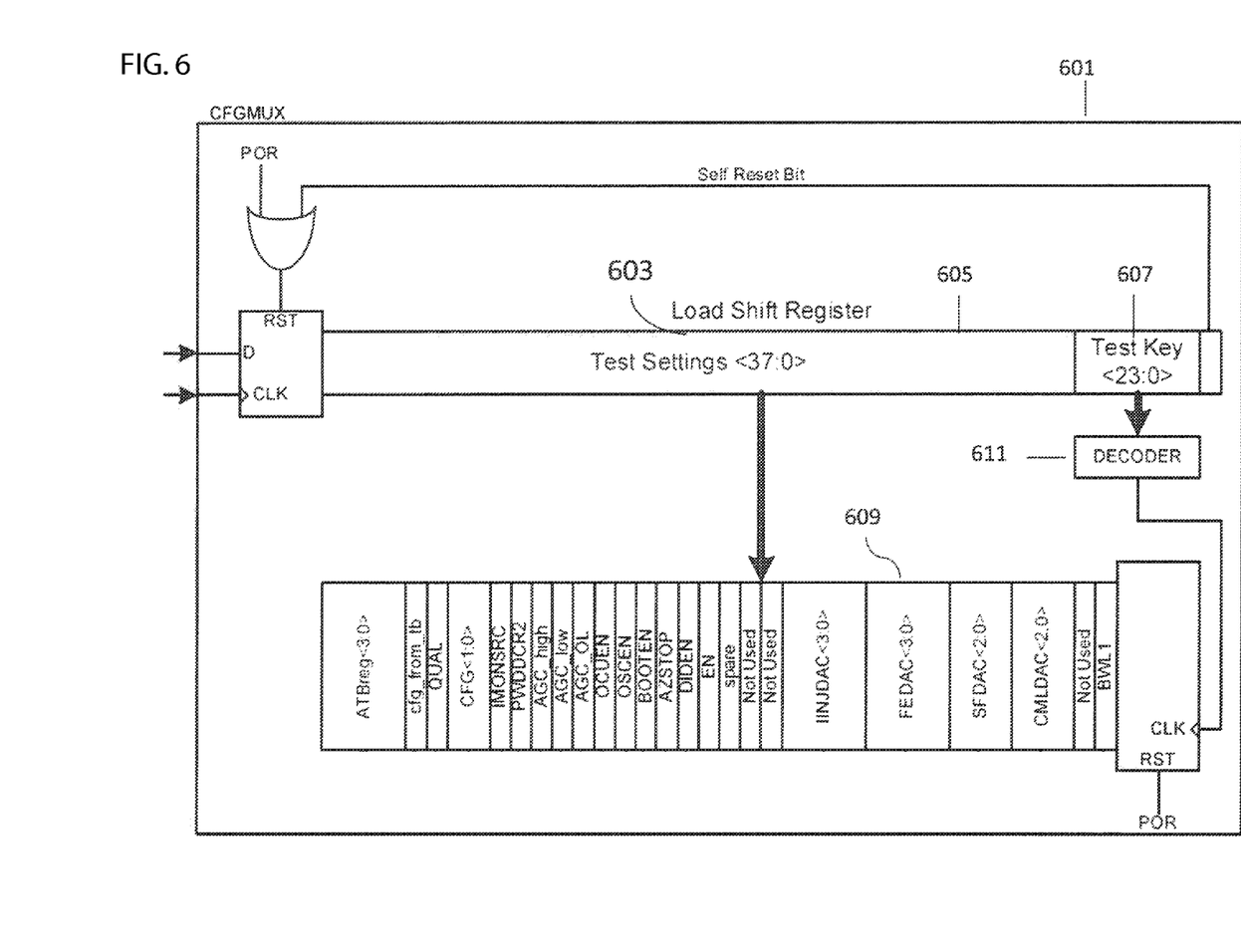
FIG. 6 shows decoding apparatus according some embodiments.

Reference is made to FIG. 6 which shows decoding apparatus according some embodiments. It should be appreciated that description of the decoding apparatus is by way of example and alternative methods of decoding the control information may be used. Decoding circuitry 601 comprises a load shift register 603. Load shift register 603 is provided with the data input from the current monitor line and the recovered clock signal. The load shift register comprises two regions: a test settings region 605 and a test key region 607. Load shift register 603 is configured to clock in data from one end. The individual registers of load shift register 603 have outputs. The outputs of the test settings registers are provided to settings register 609. The outputs of the test key registers are provided to decoder 611. Decoder 611 is configured to detect if the data stored in the test key region 607 of load shift register 603 matches a predetermined pattern. Upon detecting a predetermined pattern decoder 611 is configured to provide a clock pulse on a clock signal input to settings register 609. When the clock pulse is received at settings register 609 the data from the test settings region 605 of load shift register 603 are clocked into settings register. Accordingly, decoding circuit 601 determines when a valid word has been received by matching the test key to a predetermined pattern and stores the settings information in the settings register. The settings register may be used to provide the settings information to other areas of the trans-impedance amplifier circuit.

Figure 7:
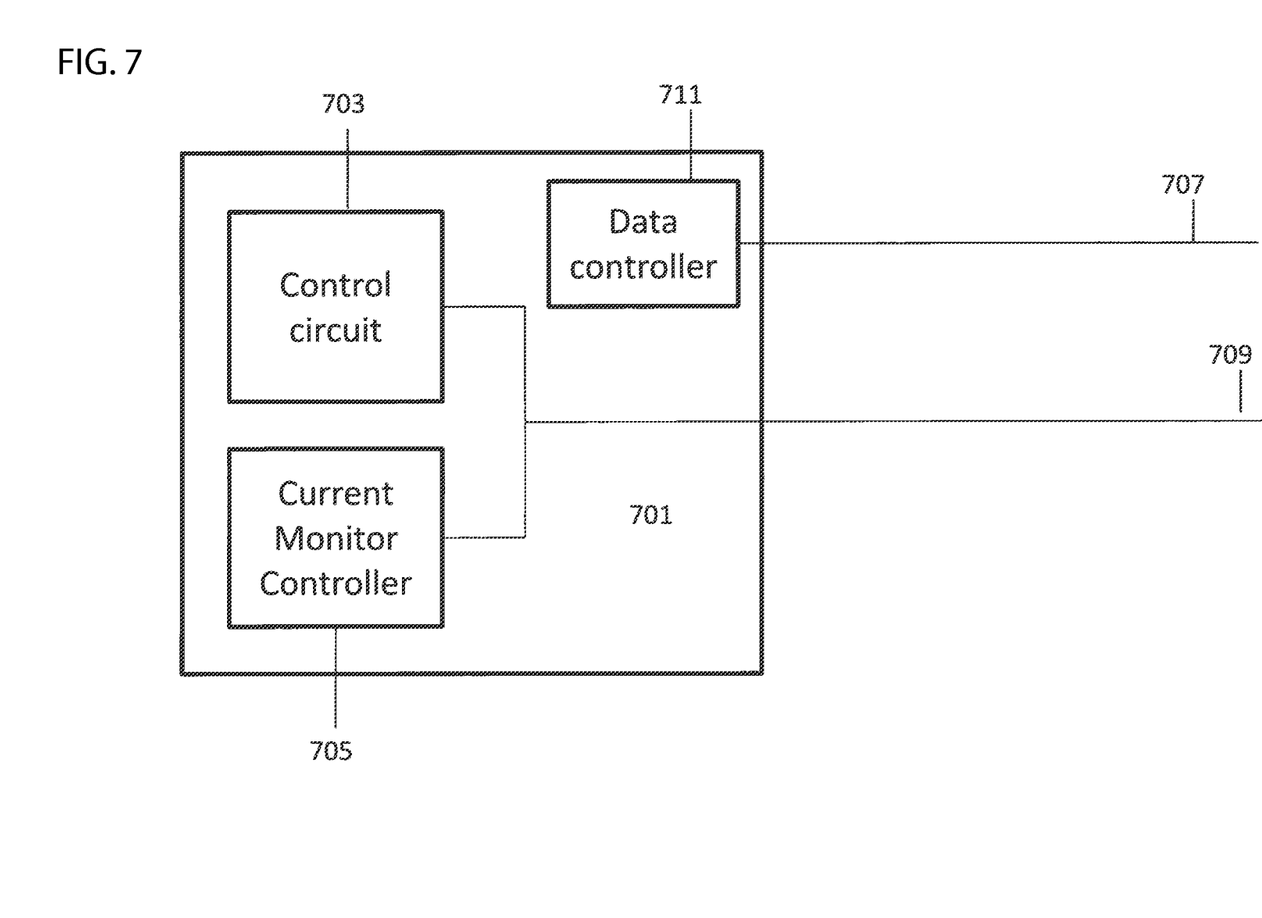
FIG. 7 shows a control module according to some embodiments.

Reference is made to FIG. 7 which shows a control module according to some embodiments. Control module 701 comprises an input 707 for receiving data from the trans-impedance amplifier package and an input 709 for receiving the current monitor signal from the trans-impedance amplifier package. The data received at input 707 are provided to data controller 711 which handles the data from the trans-impedance amplifier. The current monitor information received at input 709 is provided to current monitor controller 705 which handles the current monitor signal. Control circuit 703 provides the control information which is output to the trans-impedance amplifier package via the current monitor input 709.

Figure 8:
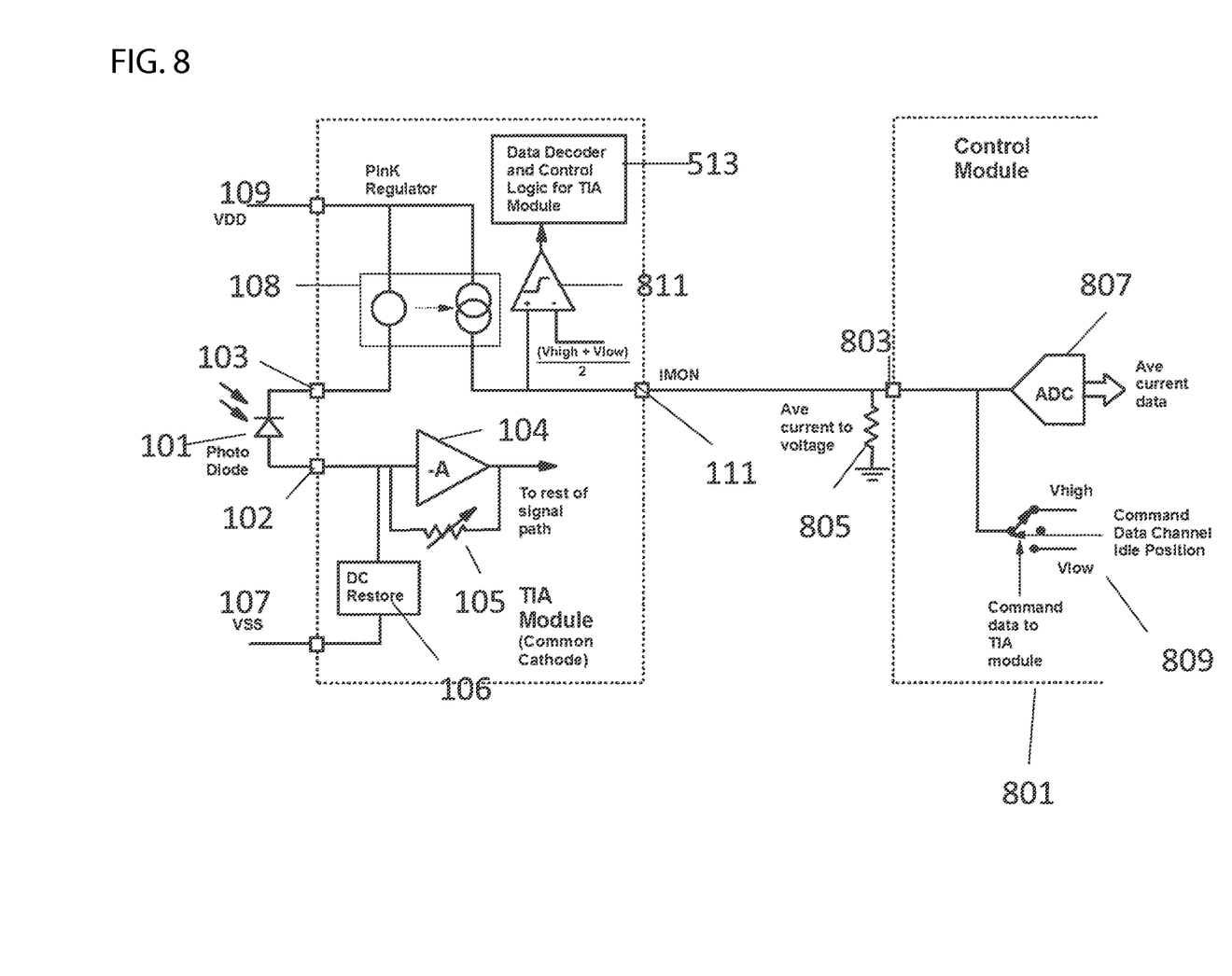
FIG. 8 shows a control module configured to send control data to a trans-impedance amplifier according to some embodiments.

Reference is made to FIG. 8 which shows an embodiment showing the TIA module of FIG. 1A connected to control module 801. The TIA module comprises comparator 811 which provides digital data to the control logic 513 sent from the control module 801 in the form of different voltage levels. These data correspond to the control information sent by the control module. Control module 801 comprises an input 803 connected to the IMON output 111 of the TIA module. A resistor 805 is provided between input 803 and ground or any convenient reference voltage to provide a current to voltage conversion. Control module 801 comprises an analogue to digital converter 807 which is configured to convert the voltage across resistor 805 to a digital value. This digital value corresponds to the average current monitor signal provided by the TIA.

Voltage selector 809 is provided in the control module to allow modulation of the current monitor line to provide control information to the TIA module. The voltage selector may select between any number of voltages. In one embodiment a first voltage is used to correspond to logic '1' and second voltage is used to correspond to logic '0', The voltage selector may optionally have a not connected state wherein no control information is transmitted.

In addition to the control module sending configuration and control data to the TIA module, it may also be desirable for the TIA to send data to the control module in addition to the current monitor signal. These data may contain information confirming the present configuration state of the TIA module after some change has been requested, or any other information which may be used to optimise management of the complete system.

Figure 9:
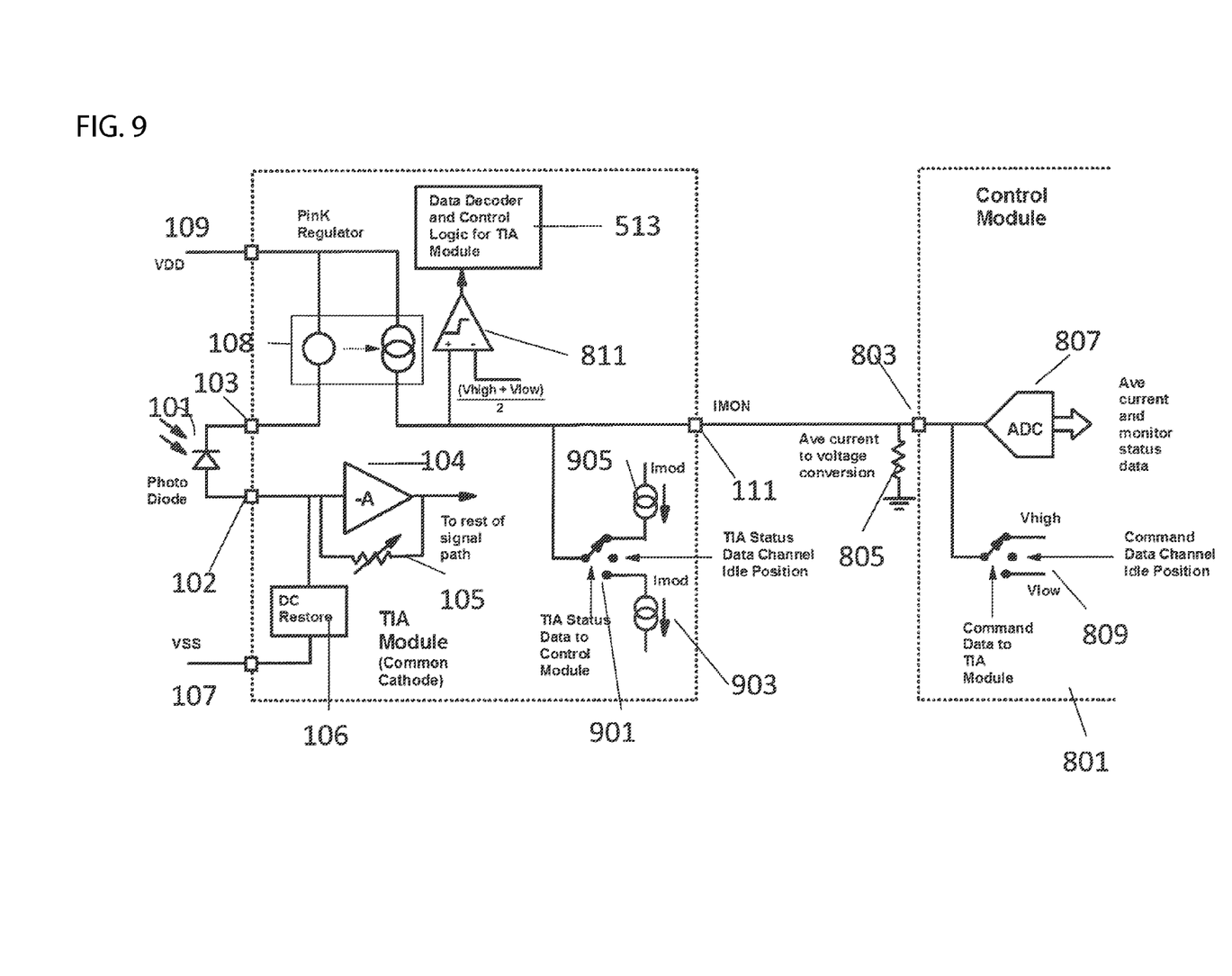
FIG. 9 shows a control module and a trans-impedance amplifier module configured to transmit data to each other according to some embodiments.

Reference is made to FIG. 9 which shows the embodiment of FIG. 8 with the addition of example apparatus for allowing bidirectional communication. The TIA comprises selector 901 which allows the IMON output 111 to be connected to either a first current source 903, a second current source 905 or neither. The first current source 903 is configured to sink current from the IMON output whilst the second current source 905 is configured to source current. The selection of current sources 903 and 905 may be used to represent logic "1" and '0' values with the option of connecting to neither when no data are to be transmitted. It should be appreciated by those skilled in the art that selector 901 may be configured to select between any number of current sources. Furthermore the inclusion of a not connected terminal is made by example only. Accordingly, selector 901 may modulate the IMON current output 111 to carry data to the control module. In some embodiments the modulation scheme may be such that the average current is not modified. The average current corresponds to the current monitor signal and its value is of importance. Accordingly, it may be preferred that the average current value remain unchanged.

Figure 10:
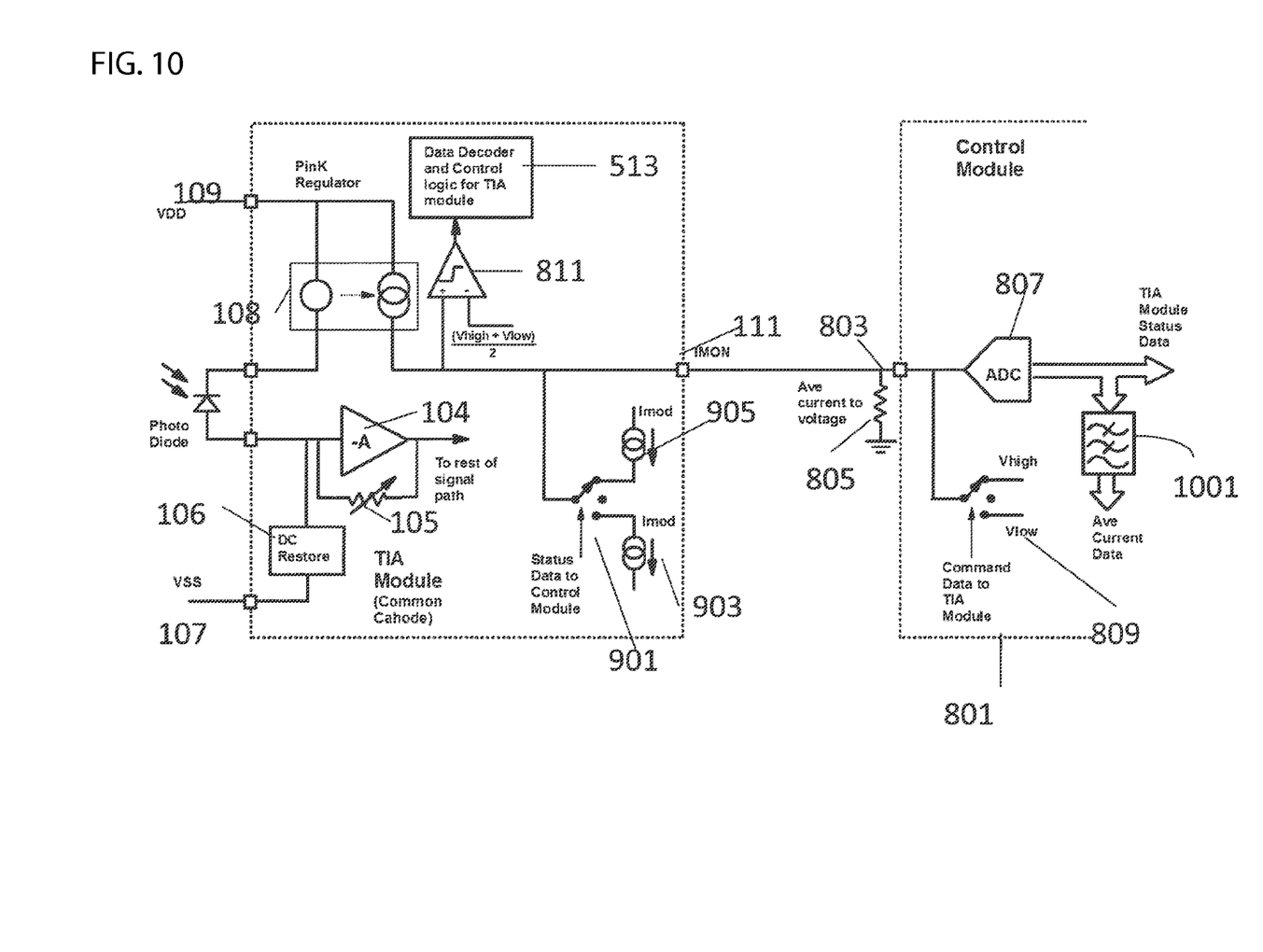
FIG. 10 shows a control module configured to separate current monitor information from control related data according to some embodiments.

Reference is made to FIG. 10 which shows the embodiment of FIG. 9 with the addition of low pass filter 1001. Low pass filter 1001 is provided in the control module to extract the average current monitor signal when both data and the current monitor signal are transmitted at the same time from the TIA. Low pass filter 1001 receives the output of analogue to digital converter 807 and removes the high frequency components of the data. Accordingly, the control module is able to separate the current monitor signal and the data signal such that both may be transmitted concurrently.

Figure 11:
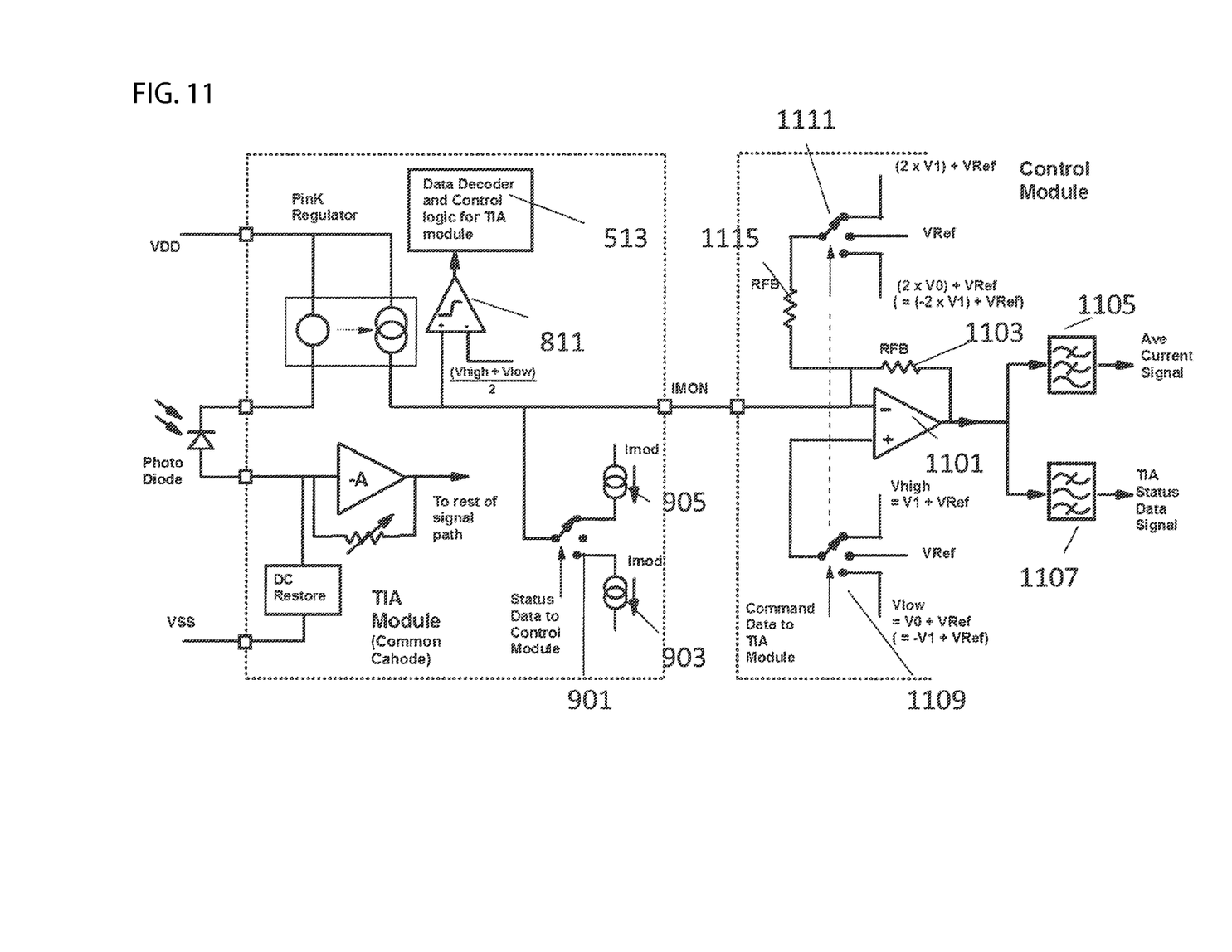
FIG. 11 shows apparatus for modulating the current monitor voltage without affecting the sensing of the current according to some embodiments.

It may be further desirable to be able to transmit data in both directions simultaneously while at the same time being able to observe the current monitor signal. Reference is made to FIG. 11 which shows an embodiment comprising apparatus for transmitting data simultaneously in both directions between the controller and the TIA module without significantly affecting the current monitor signal. In FIG. 11, the IMON terminal is provided to the inverting input of operational amplifier 1101 in the control module. Feedback resistor 1103 is provided between the inverting input and the output of operational amplifier 1101. The output of operational amplifier 1101 is further provided to filters 1105 and 1107. Filter 1105 is configured to extract the average current signal and may be a low-pass filter. Filter 1107 is configured to extract the data from the output of the amplifier 1101 and may be a high-pass filter or a band-pass filter. A voltage selector 1109 is provided and is configured to provide one of a plurality of voltages to the non-inverting input of operational amplifier 1101. Due to the high input impedance and high open-loop gain of an operational amplifier, the voltages at the inverting and non-inverting input of operational amplifier 1101 in normal operation are driven to be substantially the same. Accordingly, by modulating the voltage at the non-inverting input with voltage selector 1109, the voltage at the IMON input is similarly modulated. In FIG. 11, voltage selector 1109 selects between three voltages. It should be appreciated that any number of voltages may be used.

By modifying the voltage in this way, the current monitor current may be modified in an unwanted way. Accordingly, it may be desirable to provide a compensation current to cancel out the current added to the current monitor signal. Resistor 1115 is provided between the inverting input of operational amplifier 1101 and voltage selector 1111 to provide a compensation current to the feedback loop of amplifier 1101. Voltage selector 1111 is configured to be switched along with voltage selector 1109 such that the compensation current cancels out any voltage added to or subtracted from the output of amplifier 1101 as a result of modulating the voltage of the IMON line.

Figure 12:
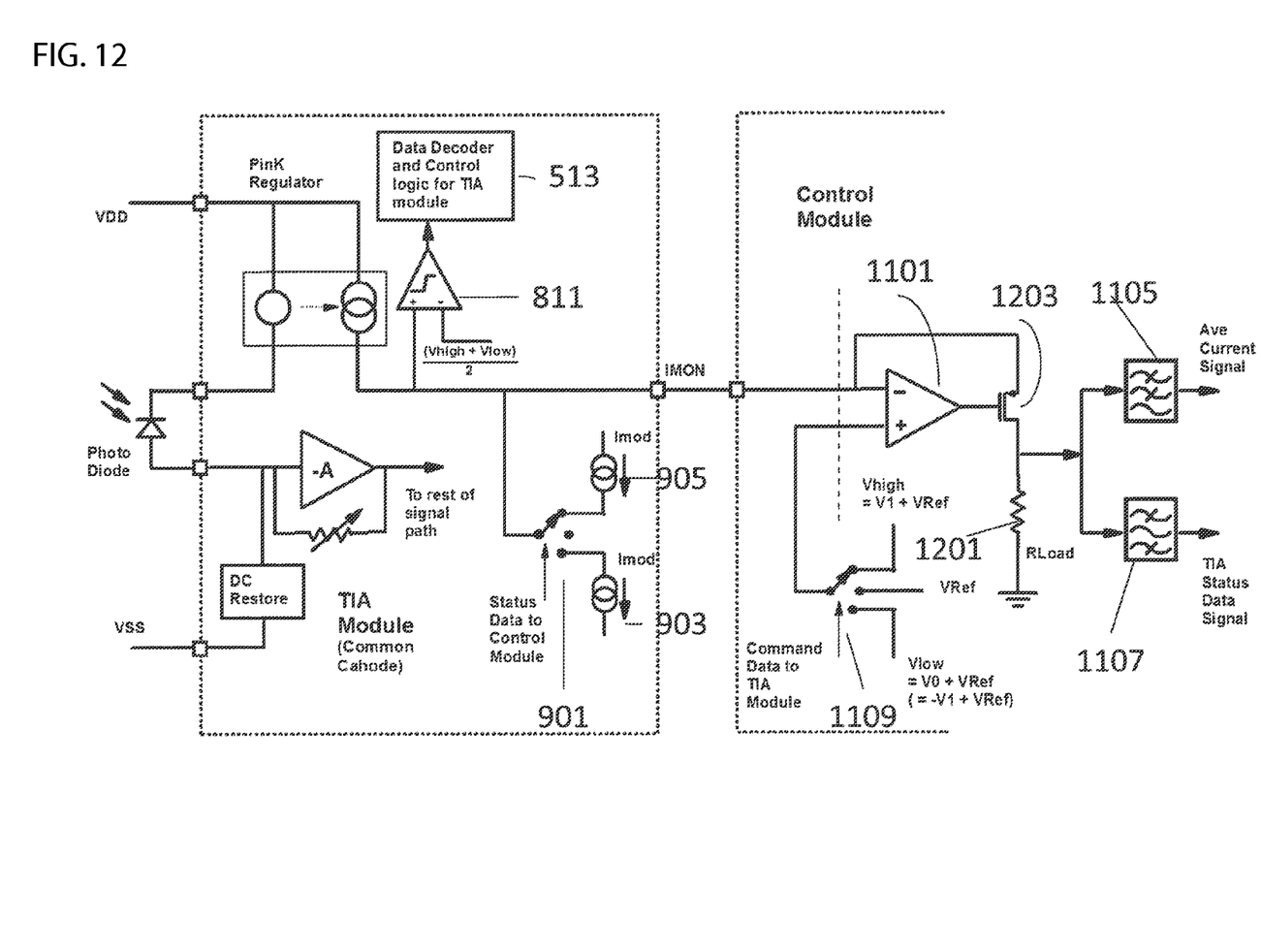
FIG. 12 shows apparatus for modulating the current monitor voltage without affecting the sensing of the current according to some embodiments.

FIG. 12 shows an embodiment that does not require a compensation current. In the control module, the gate of a P-channel MOS (Metal Oxide Semiconductor) transistor 1203 is provided to the output of operational amplifier 1101 with the source provided to the non-inverting input. The drain of transistor 1101 is provided to filters 1105 and 1107 with a load resistor 1201 which converts the received current signal to a voltage. This arrangement is shown by way of example and other arrangements will be apparent to those skilled in the art. For example, in the case where the IMON average current is sunk by the TIA module the P-channel MOS transistor 1203 would be replaced by an N-channel MOS transistor and the resistor 1207 would be connected to a positive supply. It is also possible to use a bipolar transistor in place of the field effect transistor. Filters 1105 and 1107 may then separate the current monitor signal from the data. In this embodiment, voltage selector 1109 may modulate the voltage of the IMON signal without affecting the voltage observed across the load resistor 1201 and hence the average current and any data from the TIA module encoded in terms of current variations may be extracted without interference.

It is also noted herein that while the above describes embodiments of the invention, there are several variations and modifications which may be made to the disclosed solution without departing from the scope of the present invention.

Some aspects and features of the disclosed embodiments are set out in the following numbered items:

1. A trans-impedance amplifier arrangement comprising: an input configured to receive an output from a photo-detector; a current monitoring circuit configured in use to provide a current monitor signal dependent on a current through the photo-detector; and an output configured to output said current monitor signal to a control module, said output further configured to receive control information from said control module.

2. The trans-impedance amplifier arrangement of item 1, wherein the current monitoring circuit comprises a current mirror.

3. The trans-impedance amplifier arrangement of items 1 or 2 wherein said output is further configured to provide said received control information to a control circuit.

4. The trans-impedance amplifier arrangement of item 3, wherein said control circuit is configured to compare at least part of said received control information with a predetermined code.

5. The trans-impedance amplifier arrangement of item 4, wherein said control circuit is configured to provide configuration information to one or more configurable modules of the trans-impedance amplifier in dependence on said the result of said comparing.

6. The trans-impedance amplifier arrangement of any of items 3 to 5, wherein said control circuit comprises a shift register for receiving said control information.

7. The trans-impedance amplifier arrangement of any preceding item, wherein said control information is transmitted by a modulated signal 8. The trans-impedance amplifier arrangement of any preceding item, wherein said output is further configured to transmit trans-impedance amplifier information relating to at least one of configuration and operation of the trans-impedance amplifier to said control module.

9. The trans-impedance amplifier arrangement of item 8 wherein said trans-impedance amplifier information is transmitted by the current monitor signal.

10. The trans-impedance amplifier arrangement of item 9, comprising means for modulating said current monitor signal to transmit said trans-impedance amplifier information.

11. The trans-impedance amplifier arrangement of item 9 or 10, wherein one or more discrete current values are added at different times so as not to alter the average current value of the current monitor signal and to provide said trans-impedance amplifier information.

12. The trans-impedance amplifier arrangement of any of items 8 to 11 comprising: a first current source; a second current source; and means for connecting the output to the first and second current sources dependent on said trans-impedance amplifier information.

13. A control module comprising: an input configured, in use, to receive data from a trans-impedance amplifier circuit; and a control circuit configured, in use, to provide control information to said trans-impedance amplifier circuit via an output, said output further configured to receive a current monitor signal from said trans-impedance amplifier circuit.

14. The control module of item 13, wherein said control information comprises a control header.

15. The control module of item 14, wherein said control header is useable by the trans-impedance amplifier circuit to determine when control information has been received.

16. The control module of any of items 13 to 15 wherein said control information comprises configuration information for one or more configurable modules of the trans-impedance amplifier.

17. The control module of any of items 13 to 16 wherein said control circuit is configured to transmit said control information with a modulated signal.

18. The control module of item 17, wherein one of a voltage and a current is modulated to provide said control information.

19. The control module of any of items 13 to 18, wherein said received current monitor signal comprises an average current signal and one or more discrete current values corresponding to trans-impedance amplifier information.

20. The control module of any of item 13 to 19, wherein said control module comprises means to modulate a voltage of said output by modulating a reference voltage.

21. The control module of item 20, comprising an operational amplifier and wherein in use: an inverting input of said operational amplifier is provided to said output; and an non-inverting input of said operational amplifier is modulated in dependence on said control information.

22. The control module of item 21, comprising a feedback resistor between the inverting input of said operational amplifier and the output of said operational amplifier.

23. The control module of item 22, wherein a compensation current is provided to the inverting input of the operational amplifier so as to substantially cancel out voltage changes at the output of said operational amplifier caused by modulating said non-inverting input.

24. The control module of item 19, comprising means for receiving a current into the inverting input such that the value of the current is not affected by the modulation of the non-inverting input.

25. The control module of item 19 or 24, comprising: a transistor configured to one of draw current from or supply current to the inverting input of said operational amplifier, said transistor being controlled by an output of said operational amplifier; and a load resistor configured to convert the current drawn or supplied by the transistor to a voltage.

26. The control module of item 19 or any item appended thereto further comprising means for filtering a signal received at said output so as to separate said trans-impedance amplifier information from said current monitor signal.

27. The control module of item 26 wherein said means for filtering comprises at least one of: a filter configured to extract the current monitor signal; and a filter configured to extract a signal corresponding to trans-impedance amplifier information.

28. In combination a trans-impedance amplifier arrangement as described in any of items 1 to 12 with a control module as described in any of items 13 to 27.

What is claimed is:

1. A trans-impedance amplifier arrangement comprising:
   an input configured to receive an output from a photo-detector;
   a current monitoring circuit configured in use to provide a current monitor signal dependent on a current through the photo-detector; and
   an output configured to output said current monitor signal to a control module, said output further configured to receive control information from said control module.

2. The trans-impedance amplifier arrangement of claim 1 wherein said output is further configured to provide said received control information to a control circuit.

3. The trans-impedance amplifier arrangement of claim 2, wherein said control circuit is configured to compare at least part of said received control information with a predetermined code.

4. The trans-impedance amplifier arrangement of claim 3, wherein said control circuit is configured to provide configuration information to one or more configurable modules of the trans-impedance amplifier in dependence on said the result of said comparing.

5. The trans-impedance amplifier arrangement of claim 2, wherein said control circuit comprises a shift register for receiving said control information.

6. The trans-impedance amplifier arrangement of claim 1, wherein said output is further configured to transmit trans-impedance amplifier information relating to at least one of configuration and operation of the trans-impedance amplifier to said control module, wherein said trans-impedance amplifier information is transmitted by the current monitor signal.

7. The trans-impedance amplifier arrangement of claim 6, comprising a selector configured to modulate said current monitor signal to transmit said trans-impedance amplifier information.

8. The trans-impedance amplifier arrangement of claim 6, wherein one or more discrete current values are added at different times so as not to alter the average current value of the current monitor signal and to provide said trans-impedance amplifier information.

9. The trans-impedance amplifier arrangement of claim 6 comprising:
   a first current source;
   a second current source; and
   a selector configured to connect the output to the first and second current sources dependent on said trans-impedance amplifier information.

10. A control module comprising:
    an input configured, in use, to receive data from a trans-impedance amplifier circuit; and
    a control circuit configured, in use, to provide control information to said trans-impedance amplifier circuit via an output,
    said output further configured to receive a current monitor signal from said trans-impedance amplifier circuit.

11. The control module of claim 10, wherein said control information comprises a control header.

12. The control module of claim 10 wherein said control information comprises configuration information for one or more configurable modules of the trans-impedance amplifier.

13. The control module of claim 10 wherein said control circuit is configured to transmit said control information with a modulated signal.

14. The control module of claim 13, wherein one of a voltage and a current is modulated to provide said control information.

15. The control module of claim 10, wherein said received current monitor signal comprises an average current signal and one or more discrete current values corresponding to trans-impedance amplifier information.

16. The control module of claim 15 comprising at least one of:
- a filter configured to extract the current monitor signal; and
- a filter configured to extract a signal corresponding to trans-impedance amplifier information.

17. The control module of claim 10, wherein said control module comprises a voltage selector configured to modulate a voltage of said output by modulating a reference voltage.

18. The control module of claim 17, comprising an operational amplifier and wherein in use:
- an inverting input of said operational amplifier is provided to said output; and
- an non-inverting input of said operational amplifier is modulated in dependence on said control information.

19. The control module of claim 18, wherein a compensation current is provided to the inverting input of the operational amplifier so as to substantially cancel out voltage changes at the output of said operational amplifier caused by modulating said non-inverting input.

20. The control module of claim 17, comprising:
- a transistor configured to one of draw current from or supply current to the inverting input of said operational amplifier, said transistor being controlled by an output of said operational amplifier; and
- a load resistor configured to convert the current drawn or supplied by the transistor to a voltage.

\* \* \* \* \*